United States Patent
Drogi (10) Patent No.: US 8,841,967 B2
(45) Date of Patent: Sep. 23, 2014

(54) NOISE OPTIMIZED ENVELOPE TRACKING SYSTEM FOR POWER AMPLIFIERS

(71) Applicant: Quantance, Inc., San Mateo, CA (US)

(72) Inventor: Serge Francois Drogi, Flagstaff, AZ (US)

(73) Assignee: Quantance, Inc., San Mateo, CA (US)

( * ) Notice: Subject to any disclaimer, the term of this patent is extended or adjusted under 35 U.S.C. 154(b) by 30 days.

(21) Appl. No.: 13/778,713

(22) Filed: Feb. 27, 2013

(65) Prior Publication Data

US 2013/0229228 A1 Sep. 5, 2013

Related U.S. Application Data

(60) Provisional application No. 61/606,449, filed on Mar. 4, 2012.

(51) Int. Cl.
*H03G 3/20* (2006.01)
*H03G 3/00* (2006.01)
*H03F 1/02* (2006.01)

(52) U.S. Cl.
CPC ............. *H03G 3/004* (2013.01); *H03F 1/0227* (2013.01); *H03F 1/0238* (2013.01)
USPC .......................................... 330/136; 330/279

(58) Field of Classification Search
USPC ............................ 330/136, 279, 297, 285, 296
See application file for complete search history.

(56) References Cited

U.S. PATENT DOCUMENTS

| | | | |
|---|---|---|---|
| 5,142,240 A | 8/1992 | Isota et al. | |
| 5,251,330 A | 10/1993 | Chiba et al. | |
| 5,862,460 A | 1/1999 | Rich | |
| 6,166,598 A | 12/2000 | Schlueter | |
| 6,459,742 B1 | 10/2002 | Marque-Pucheu et al. | |
| 8,081,029 B2 * | 12/2011 | Ohba et al. | 330/149 |
| 8,159,297 B2 * | 4/2012 | Kumagai | 330/149 |
| 8,665,017 B2 * | 3/2014 | Onishi | 330/136 |

(Continued)

FOREIGN PATENT DOCUMENTS

WO    WO 02/078208 A2    10/2002

OTHER PUBLICATIONS

Kimball, D.F. et al., "High-Efficiency Envelope-Tracking W-CDMA Base-Station Amplifier Using GaN HFETs," IEEE Transactions on Microwave Theory and Techniques, Nov. 2006, pp. 3848-3856, vol. 54, No. 11.

(Continued)

*Primary Examiner* — Henry Choe
(74) *Attorney, Agent, or Firm* — Fenwick & West LLP (57) ABSTRACT

A radio frequency (RF) power amplifier system that comprises a power amplifier configured to amplify an RF input signal to generate an RF output signal. The power amplifier has a gain that is controlled by a supply voltage to the power amplifier. An amplitude detector is configured to generate an amplitude signal indicative of an amplitude of the RF input signal. A power supply generates the supply voltage to the power amplifier based on the amplitude signal indicative of the amplitude of the RF input signal. The gain of the power amplifier is allowed to have variations over the amplitude range of the RF input signal in favor of having a supply voltage that is monotonic relative to the amplitude of the RF input signal across an amplitude range of the RF input signal.

19 Claims, 8 Drawing Sheets

(56) References Cited

U.S. PATENT DOCUMENTS

| | | |
|---|---|---|
| 8,710,925 B2* | 4/2014 | Drogi et al. ............... 330/136 |
| 2004/0136470 A1 | 7/2004 | DeBruyn et al. |
| 2004/0224635 A1 | 11/2004 | Nicol et al. |
| 2005/0017801 A1 | 1/2005 | Bachman et al. |
| 2007/0229330 A1 | 10/2007 | Guda et al. |
| 2011/0043282 A1 | 2/2011 | Drogi et al. |

OTHER PUBLICATIONS

PCT International Search Report and Written Opinion, PCT Application No. PCT/US2013/028054, May 6, 2013, 20 pages.

Wang, F. et al., "Design of Wide-Bandwidth Envelope-Tracking Power Amplifiers for OFDM Applications," IEEE Transactions on Microwave Theory and Techniques, Apr. 2005, pp. 1244-1255, vol. 53, No. 4.

* cited by examiner

NOISE OPTIMIZED ENVELOPE TRACKING SYSTEM FOR POWER AMPLIFIERS

CROSS REFERENCE TO RELATED APPLICATION

This application claims priority from U.S. Provisional Patent Application No. 61/606,449, filed on Mar. 4, 2012, the contents of which are incorporated by reference herein in their entirety.

BACKGROUND

1. Field of the Disclosure

The present disclosure relates to Radio Frequency (RF) Power Amplifier (PA) systems, and more specifically to an RF PA system with reduced spectral noise.

2. Description of the Related Art

RF transmitters and RF PAs are widely used in portable electronic devices such as cellular phones, laptop computers, and other electronic devices. RF transmitters and RF PAs are used in these devices to amplify and transmit the RF signals remotely. RF PAs are one of the most significant sources of power consumption in these electronic devices, and their efficiency has a significant impact on the battery life of these portable electronic devices. For example, cellular telephone makers make great efforts to increase the efficiency of the RF PA systems, because the efficiency of the RF PAs is one of the most critical factors determining the battery life of the cellular telephone and its talk time. One approach to increasing the efficiency of RF PA systems is envelope tracking. In envelope tracking, the power supply voltage applied to the PA is constantly adjusted to ensure that the PA is operating at peak efficiency for the given instantaneous output power requirements.

Another concern in RF PAs is keeping the distortion in the RF output signal of the RF PA below acceptable levels. Distortion occurs whenever the actual RF output signal of the RF PA differs from the desired RF output signal. Amplitude differences, phase differences, and other factors can contribute to the distortion in the RF output signal. Envelope tracking power systems attempt to minimize distortion by adjusting the supply voltage to the PA so that the gain of the PA is as uniform as the output power requirements change. Having a uniform gain in the PA tends to minimize amplitude and phase errors in the output signal. However, attempting to maintain a uniform gain in the PA can introduce non-monotonic variations in the supply voltage to the PA that increase spectral noise produced by the RF PA. Since the RF spectrum is shared amongst users of cellular telephones, having a wide spectral distortion is undesirable.

SUMMARY

Embodiments of the present disclosure include a radio frequency (RF) power amplifier system that adjusts the supply voltage provided to the PA in a monotonic manner such that the supply voltage increases or is flat (non-decreasing) as the amplitude of the RF input signal increases. The monotonicity reduces variations in the supply voltage to the PA, but may introduce some additional variations in the gain of the PA. However, the reduced distortion due to making the supply voltage vary in a monotonic manner outweighs the modest additional distortion caused by the gain variations and still results in an overall reduction in the spectral noise in the RF output signal of the PA.

In one embodiment, the radio frequency (RF) power amplifier system comprises a power amplifier configured to amplify an RF input signal to generate an RF output signal. A gain of the power amplifier is controlled by a supply voltage to the power amplifier. An amplitude detector is configured to generate an amplitude signal indicative of the amplitude of the RF input signal. A power supply is configured to generate the supply voltage to the power amplifier based on the amplitude signal indicative of the amplitude of the RF input signal. The supply voltage is monotonic relative to the amplitude of the RF input signal across an amplitude range of the RF input signal. During a first portion of the amplitude range of the RF input signal, the gain of the power amplifier is substantially constant while the supply voltage is adjusted monotonically relative to the amplitude of the RF input signal. During a second portion of the amplitude range of the RF input signal, the gain of the power amplifier is substantially non-constant while the supply voltage is adjusted monotonically relative to the amplitude of the RF input signal.

In one embodiment, a method of operation in the RF power amplifier system comprises generating an amplitude signal indicative of an amplitude of an RF input signal to a power amplifier, the power amplifier amplifying the RF input signal to generate an RF output signal. The method also comprises generating a supply voltage to the power amplifier based on the amplitude signal indicative of the amplitude of the RF input signal, the supply voltage being monotonic relative to the amplitude of the RF input signal across an amplitude range of the RF input signal, the power amplifier having a gain that is controlled by the supply voltage to the power amplifier. During a first portion of the amplitude range of the RF input signal, the gain of the power amplifier is substantially constant while the supply voltage is adjusted monotonically relative to the amplitude of the RF input signal. During a second portion of the amplitude range of the RF input signal, the gain of the power amplifier is substantially non-constant while the supply voltage is adjusted monotonically relative to the amplitude of the RF input signal.

In another embodiment, the RF power amplifier system includes a power supply controller configured to generate a power supply control signal for controlling a supply voltage to the power amplifier by referencing a look-up table of values for the supply voltage control signal that correspond to levels of the amplitude signal. A method of operation for this RF power amplifier system comprises generating non-monotonic values for the values of the look-up table. The non-monotonic values are non-monotonic relative to the amplitude of the RF input signal across an amplitude range of the RF input signal and correspond to a substantially constant gain of the power amplifier across the amplitude range of the RF input signal. The method also comprises generating monotonic values for the values of the look-up table based on the non-monotonic values. The monotonic values are monotonic relative to the amplitude of the RF input signal across the amplitude range of the RF input signal.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the present invention can be readily understood by considering the following detailed description in conjunction with the accompanying drawings.

DETAILED DESCRIPTION OF EMBODIMENTS

The Figures (FIG.) and the following description relate to preferred embodiments of the present disclosure by way of illustration only. It should be noted that from the following discussion, alternative embodiments of the structures and methods disclosed herein will be readily recognized as viable alternatives that may be employed without departing from the principles of the claimed disclosure.

Reference will now be made to several embodiments of the present disclosure, examples of which are illustrated in the accompanying figures. Wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the disclosure described herein.

Embodiments of the present disclosure include a radio frequency (RF) power amplifier system that adjusts the supply voltage provided to the PA in a monotonic manner. The supply voltage is monotonic relative to the amplitude of an RF input signal over a certain amplitude range of the RF input signal (e.g., the entire amplitude range or a smaller portion therefor). The monotonicity reduces variations in the supply voltage to the PA, but may introduce some additional variations in the gain of the PA. However, the reduced distortion associated by making the supply voltage monotonic outweighs the additional distortion caused by the gain variations and still results in an overall reduction in the spectral noise in the RF output signal of the PA. In one embodiment, the supply voltage is controlled through a monotonic look up table. The values in the look up table are calibrated by first generating values for the look up table that are non-monotonic and then adjusting the non-monotonic values until they become monotonic.

Figure 1:
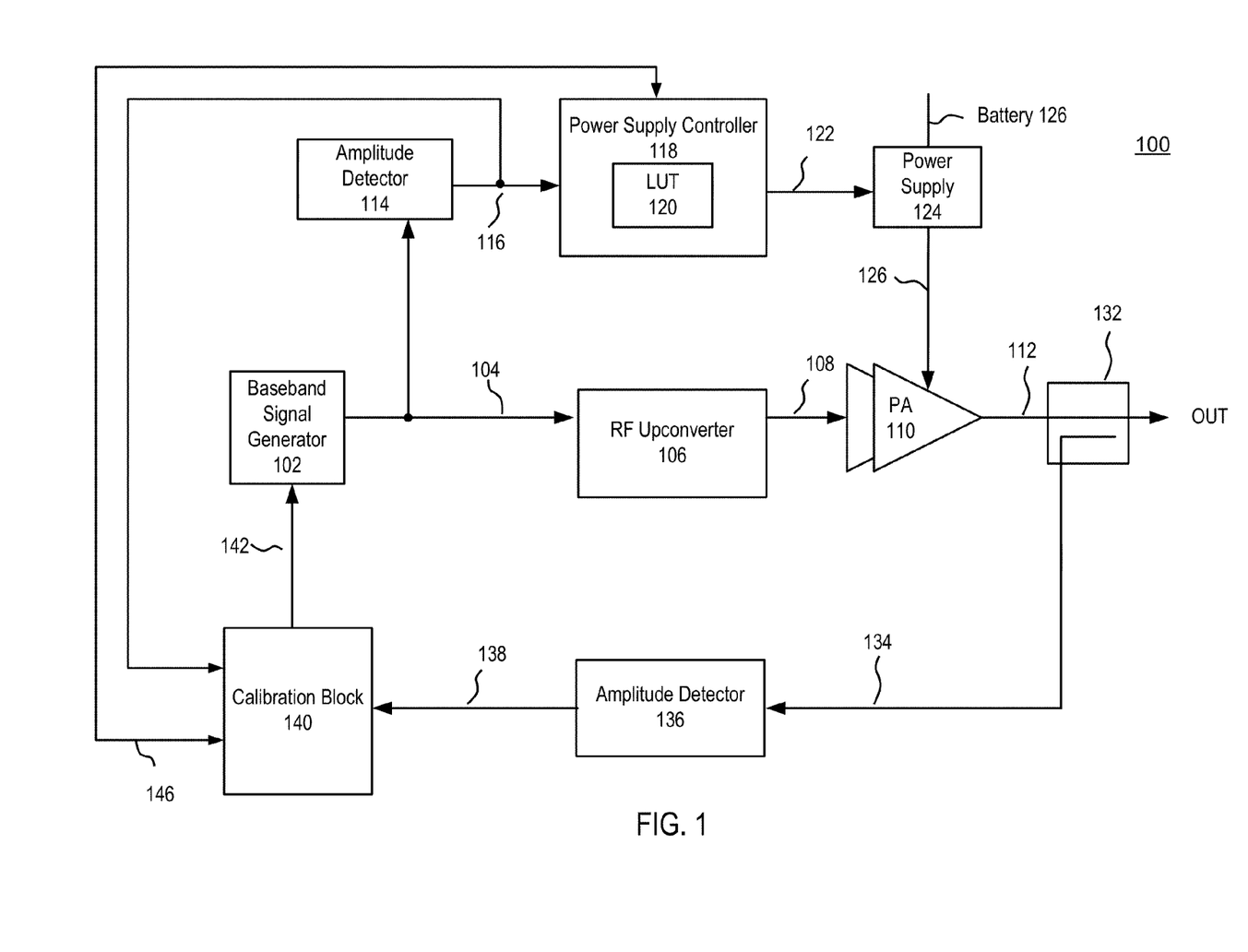
FIG. 1 illustrates a RF power amplifier (PA) system, according to an embodiment.

FIG. 1 illustrates a RF power amplifier (PA) system 100, according to an embodiment. In one embodiment, the RF PA system 100 can be found in a mobile device such as a cellular telephone, a smart phone, a tablet computer, a wireless dongle for a computer, etc. The RF PA system 100 communicates wirelessly with a remote device by transmitting data via RF signals. The RF PA system 100 may also include additional circuitry (not shown) for receiving data from the remote device.

The main transmit signal path originates at baseband signal generator 102, where a baseband signal 104 intended for transmission is digitally generated. Baseband signal 104 may include digital modulation components, such as I (in-phase) and Q (quardature-phase) components. RF upconverter block 106 upconverts the baseband signal 104 to a desired RF carrier frequency, generating RF input signal 108. RF input signal 108 may be an RF signal modulated according to one or more cellular telephone standards, such as LTE (Long Term Evolution), UMTS (Universal Mobile Telephone System) or CDMA (Code Division Multiple Access). RF input signal 108 can have varying amplitude and/or varying phase.

PA 110 receives the RF input signal 106 and generates a RF output signal 112 under the control of an adjustable supply voltage 126. The adjustable supply voltage 126 generally tracks the amplitude of the RF input signal 108. The adjustable supply voltage 126 also controls the gain of the PA 110, which affects the amount of amplification applied to RF input signal 108 to generate the RF output signal 112. Generally, as the adjustable supply voltage 126 increases, the gain of the PA 110 increases. As the adjustable supply voltage 126 decreases, the gain of the PA 110 decreases. The gain of the PA 110 can also be limited if the supply voltage 126 does not provide enough headroom to power the RF output signal 112.

In one embodiment, the PA 110 can have one or more amplification stages that amplify the RF input signal 106 in order to generate the RF output signal 112. An example of a PA 110 is a two stage class A/B amplifier. The PA 110 may have non-linear gain characteristics that vary depending on the level of the adjustable supply voltage 126 and the amplitude of the RF input signal 106. The gain characteristics of the PA 110 will be described in greater detail by reference to FIG. 2b.

The PA 110 generates an RF output signal 112, which drives a number of passive components such as directional coupler 132 and other components (not shown). Ultimately, the RF output signal 112 drives an antenna (not shown) that produces wireless RF signal for transmission to a remote device. The amplification process may also introduce distortions in the RF output signal 112 that cause it to differ from an ideal RF output signal Amplitude detector 114, power supply controller 118, and power supply 124 form the power supply path for adjusting the supply voltage 126 to the PA 110. Initially, amplitude detector 114 receives the baseband signal 104 and uses the baseband signal 104 to generate an input amplitude signal 116. Because RF input signal 108 is an upconverted version of the baseband signal 104 and input amplitude signal 116 is generated from the baseband signal 104, the input amplitude signal 116 effectively represents the amplitude of the RF input signal 108. In one embodiment, the amplitude detector 114 calculates the amplitude of the RF input signal 108 using the function $\sqrt{I^2+Q^2}$ and uses this calculated amplitude in generating the input amplitude signal 116. The amplitude of the RF input signal 108 also is mathematically related to the instantaneous power of the RF input signal 108. Thus, the amplitude of the RF input signal 108 may be referred to herein as the RF input signal power, and these terms may be used interchangeably through the specification.

Power supply controller 118 receives the input amplitude signal 116 and generates a power supply control signal 122 that controls the power supply 124. Power supply control signal 122 is adjusted to ensure that the power supply 124 generates supply voltage 126 to roughly track the amplitude of the RF input signal 108. In general, for higher levels of the input amplitude signal 116, power supply controller 118 adjusts the level of the supply voltage control signal 122 in order to increase the supply voltage 126. For lower levels of the input amplitude signal 116, power supply controller 118 adjusts the level of the supply voltage control signal 122 in order to decrease the supply voltage 126.

The power supply 124 receives a battery voltage 126 and generates the adjustable supply voltage 126 under the control of the supply voltage control signal 122. The power supply 124 can be any type of power supply that is capable of regulating a level of the supply voltage 126 to the PA 110. For example, the power supply 124 can be a switch mode power supply, a linear regulator, or a combination of the two.

Additionally, power supply controller 118 generates the supply control signal 122 by referencing the input amplitude signal 116 to a look up table (LUT) of values for the supply control signal 122. The LUT 120 includes multiple look up entries that map values for the input amplitude signal 116 to corresponding values for the supply voltage control signal 122. The LUT 120 is configured to have values for the supply control signal 122 to control supply voltage 126 in a manner that maintains the gain of the power amplifier 110, for the most part, at a relatively constant level even as the amplitude of the RF input signal 108 changes. However, the values for the supply voltage control signal 122, and hence the supply voltage 126, are also adjusted in a monotonic manner relative to the amplitude of the RF input signal 108. The monotonic nature of the supply voltage 126 has the downside of causing the gain of the power amplifier 110 to occasionally dip or rise, which introduces amplitude distortion in the RF output signal 112. However, maintaining a monotonic supply voltage 126 is still beneficial because it reduces spectral noise in supply voltage 126 and therefore reduces spectral distortion in RF output signal 112. The reason for this physical behavior is that the power supply 124 has finite and in general relatively low bandwidth compared to the bandwidth of the amplitude signal 116. The effects of filtering in the power supply 124 delay the supply voltage control signal 122 creating cross modulation products at the output of the PA 110.

Figure 2A:
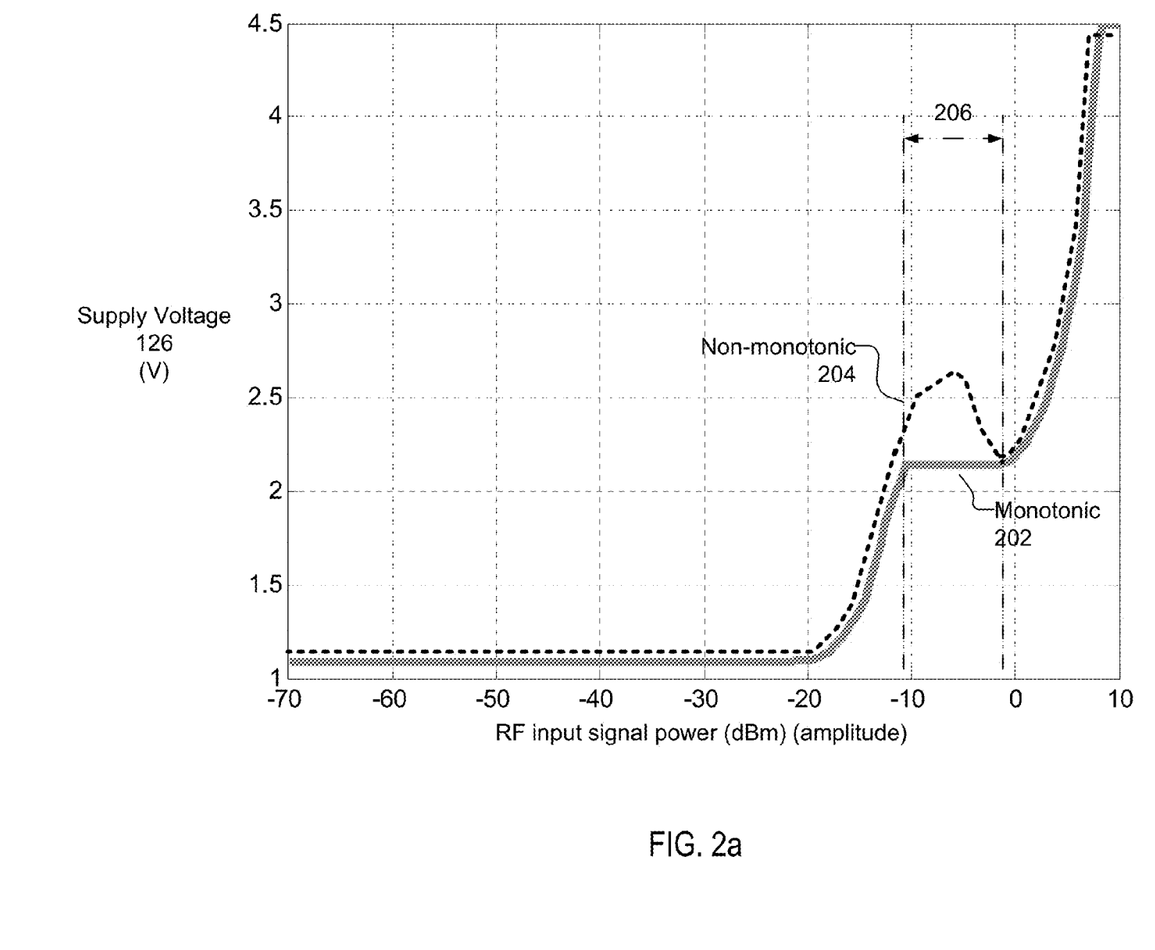
FIG. 2a is a graph illustrating how the supply voltage is adjusted monotonically relative to the amplitude of the RF input signal, according to an embodiment.

Referring now to FIG. 2a, illustrated is graph showing how the supply voltage 126 is adjusted monotonically relative to the amplitude of the RF input signal 108, according to an embodiment. The horizontal axis is the RF input signal power in decibels, which corresponds to the amplitude of the RF input signal 108. The vertical axis is the supply voltage 126 in Volts. The solid line represents a response 202 of a monotonically increasing supply voltage 126 according to an embodiment of the present disclosure. The dotted line represents a response 204 of a conventional non-monotonic supply voltage 126.

In mathematical terms, a function is monotonic over an interval if the derivatives of the function are either non-negative or non-positive over the entire interval, but not both. As shown in the figure, a supply voltage 126 with a monotonic voltage response 202 increases or is constant (i.e. non-decreasing), i.e., the derivative of the supply voltage 126 is non-negative but not non-positive, as the amplitude of the RF input signal 108 increases. The monotonic voltage response 202 is flat from −70 dBm to −19 dBm, increases from −19 dBm to −11 dBm, is flat from −11 dBm to −2 dBm during an intermediate portion 206 of the amplitude range of the RF input signal 108, and then increases from −2 dBm to 7 dBm. Notably, the monotonic voltage response 202 does not decrease as the amplitude of the RF input signal 108 increases. By contrast, the non-monotonic voltage response 204 both increases and decreases as the amplitude of the RF input signal 126 increases. The non-monotonic voltage response 204 is flat from −70 dBm to −19 dBm, increases from −19 dBm to −6 dBm, decreases from −6 dBm to −2 dBm, and then increases from −2 dBm to 7 dBm.

Figure 2B:
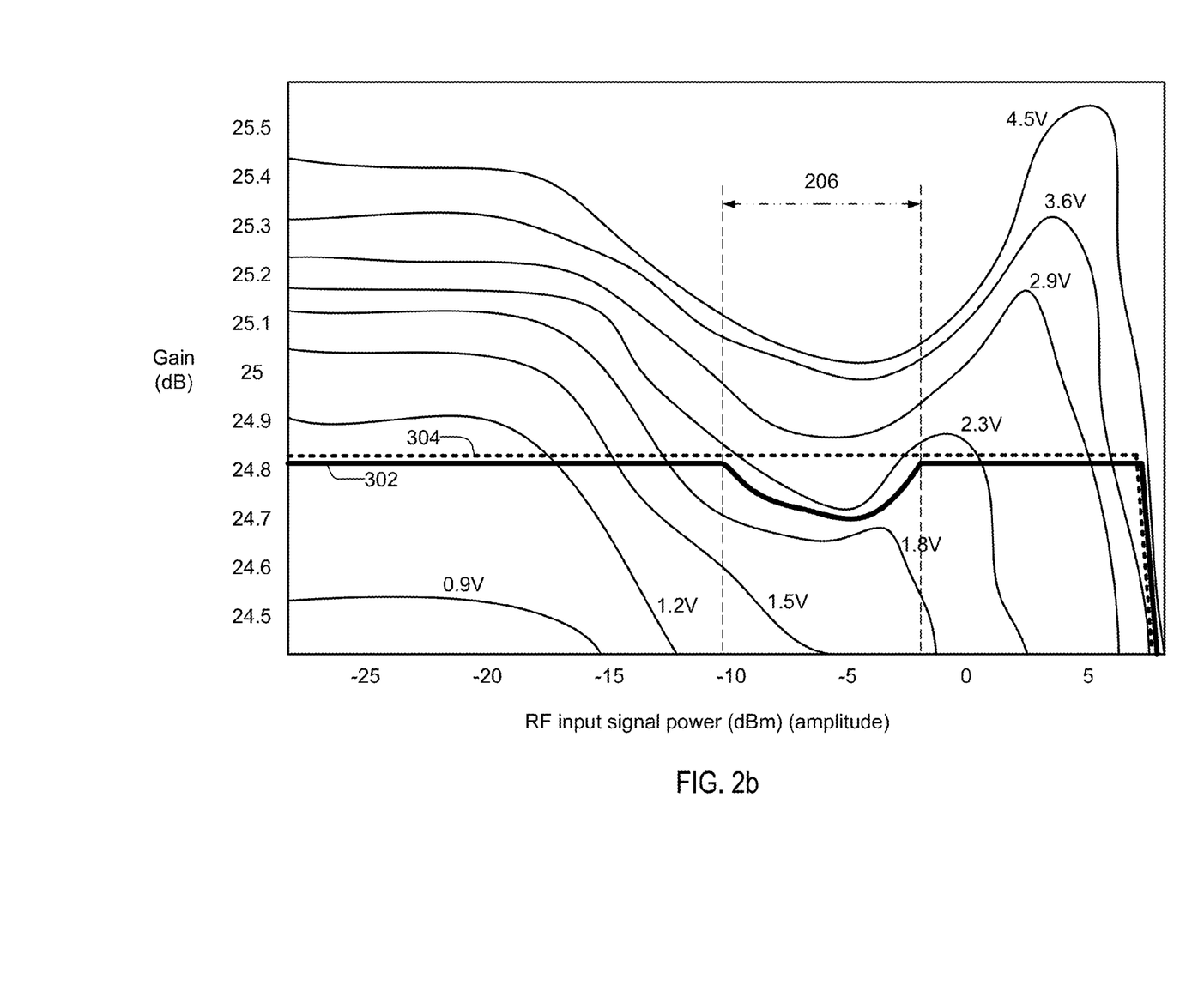
FIG. 2b is a graph illustrating the gain of the PA for monotonic and non-monotonic voltage responses of the supply voltage from FIG. 2a, according to an embodiment.

FIG. 2b is a graph illustrating the gain of the RF PA system 100 for monotonic 202 and non-monotonic voltage responses 204 of the supply voltage 126 from FIG. 2a, according to an embodiment. The horizontal axis is the RF input signal power (i.e. amplitude) in decibels. The vertical axis is the gain of the PA 110 in decibels, and may represent the power gain of the PA 110. The thinner lines labeled with a voltage are gain responses of the PA 110 at different levels of the supply voltage 126. For example, when the supply voltage 126 is 0.9 V, the gain response for PA 110 shows that the gain is approximately 24.5 dB at low RF input signal power but drops once the RF input signal power reaches −15 dBm. As another example, when the supply voltage is set to 4.5 V, the gain response shows that the gain of the PA 110 is approximately 25.4 dB at low RF input signal power and drops off once the RF input signal power reaches 7 dBm. For the purposes of illustration, only a representative set of gain responses for the supply voltage 126 are shown in FIG. 2b.

For a given level of supply voltage 126, the gain response of the PA 110 is not constant across the entire amplitude range of the RF input signal 108. This is due to the non-ideal characteristics of the PA 110. For example, the PA 110 may be a two stage PA 110 where the first stage is biased differently than the second stage. The crossover point between the bias points of the two PA 110 stages causes a dip in the gain response of the PA 110 when the RF input signal power is between approximately −15 dB and 0 dB.

Conventional PA systems attempt to maintain a constant gain in the PA 110 despite this dip in the overall gain response of the PA 110. The dotted line represents the gain response 304 of a PA 110 that is controlled using conventional methods. The gain response 304 indicates that the gain of the PA 110 is substantially constant at a target gain level of 24.8 dB as the amplitude of the RF input signal 108 increases. The gain response 304 is achieved by providing the PA 110 with a supply voltage 126 having the non-monotonic voltage response 204 of FIG. 2a. Specifically, referring to FIG. 2a, to maintain a constant gain, the supply voltage 126 is increased starting at a RF input signal power of −19 dBm until it reaches 2.6V at a RF input signal power of −6 dBm. The supply voltage 126 is then decreased until it reaches 2.2V at a RF input signal power of −2 dBm. The supply voltage 126 is then increased again until it reaches the peak voltage of 4.5V, at which point the gain drops off.

Embodiments of the present disclosure take a different approach to adjusting the supply voltage 126. Instead of adjusting the supply voltage 126 to maintain a completely constant gain in the PA 110, the supply voltage 126 is increased monotonically and the gain is allowed to fluctuate during the dip in the overall gain response of the PA 110. The thick solid line represents a gain response 302 of the PA 110 according to an embodiment of the present disclosure. The gain response 302 is achieved by providing the PA 110 with a supply voltage 126 having the monotonic voltage response 202 of FIG. 2a. Specifically, referring to FIG. 2a, the supply voltage 126 is increased starting at a RF input signal power of −19 dBm until it reaches 2.1V at a RF input signal power of −11 dBm. The supply voltage 126 is then substantially constant until the RF input signal power reaches −2 dBm. Because the supply voltage 126 is held substantially constant but the overall gain response of the PA 110 is still changing, the gain 302 of the PA 110 temporarily dips to 24.7 dB as shown in FIG. 2b. When the RF input signal power reaches −2 dBm, the supply voltage 126 is then increased again until it reaches the peak voltage of 4.5V, at which point the gain drops off.

Thus, during an intermediate amplitude range 206 of the RF input signal between −11 dBm and −2 dBm, the gain response 302 of the PA 110 not constant and varies from the target gain level of 24.8 dB. The gain response 302 decreases to 24.7 dB and then increases back to 24.8 dB. In other portions of the amplitude range of the RF input signal, such as when the RF input signal power is below −11 dBm or between −2 dBm and 5 dBm, the gain response 302 of the RF input signal 108 is held substantially constant at the target gain level of 24.8.

The additional 0.1 dB variation in the gain response 302 of the PA 110 during the intermediate amplitude range 206 introduces a small amount of distortion at the RF output signal 112. However, referring to FIG. 2a, a 0.5 V hump in the non-monotonic response 204 during the intermediate amplitude range 206, which typically introduces a large amount of spectral distortion, is no longer present in the monotonic voltage response 202. When these two effects are combined, the result is that the overall spectral distortion of the RF PA system 100 is still reduced.

In one embodiment, a gain is considered to be substantially constant over a particular amplitude range if the difference between the maximum and minimum gain over the range is less than 0.05 dB, which is approximately a 1% change in gain. In other embodiments, the gain response 302 of the PA 110 may be different (i.e. higher or lower gain level) before the dip in the gain response 302 than it is after the dip in the gain response 302, but still substantially constant.

Figure 3A:
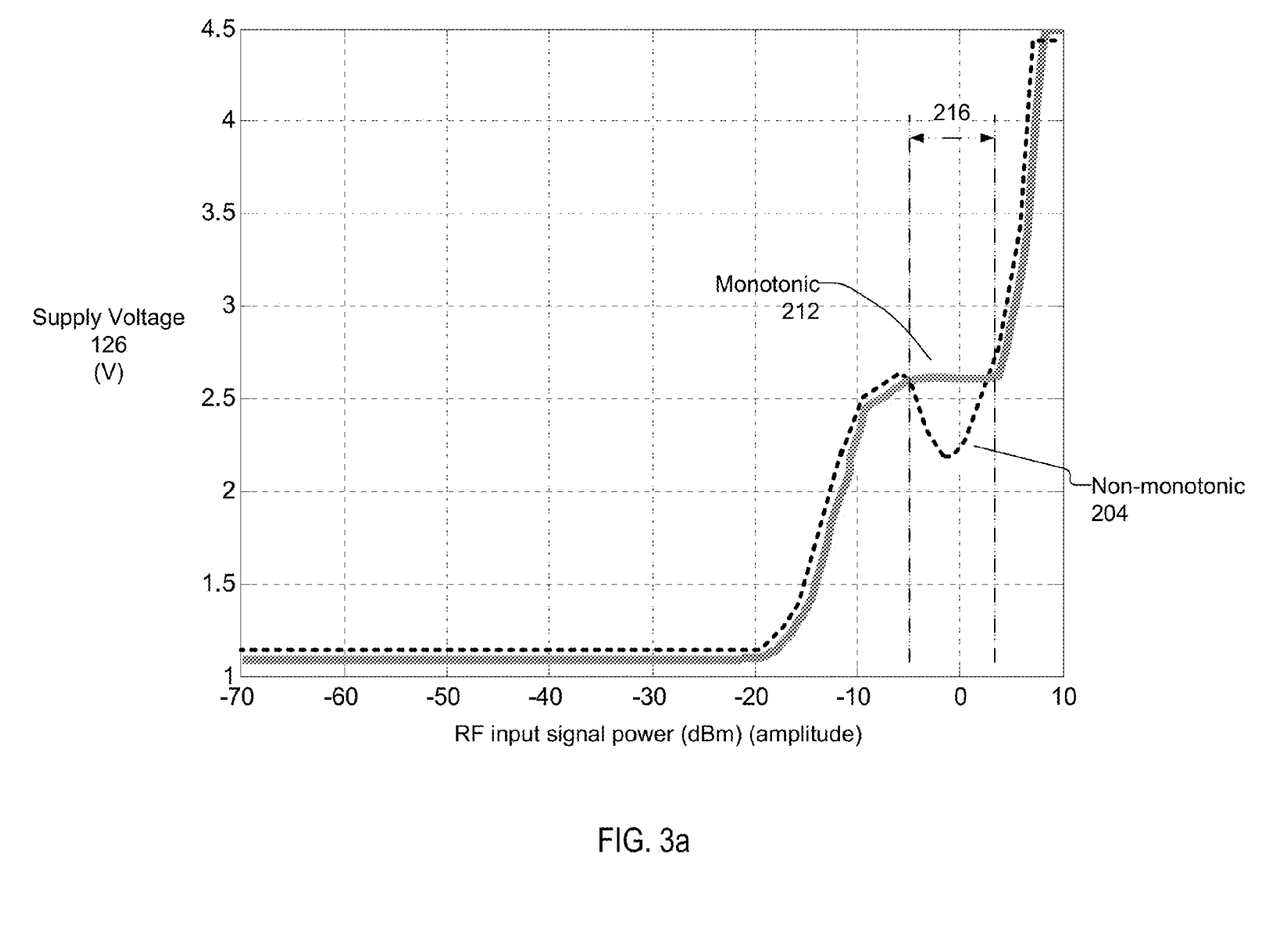
FIG. 3a is a graph illustrating how the supply voltage is adjusted monotonically relative to the amplitude of the RF input signal, according to another embodiment.

FIG. 3a is graph illustrating how the supply voltage 126 is adjusted monotonically relative to the amplitude of the RF input signal 108, according to another embodiment. The graph in FIG. 3a is similar to the graph in FIG. 2a, except that the supply voltage 126 now has a different monotonic voltage response 212. Monotonic voltage response 212 is flat in an intermediate portion 216 of the amplitude range between −5 dBm and 3 dBm. Monotonic voltage response 212 thus eliminates the dip in the non-monotonic voltage response 204 that would otherwise occur during the intermediate portion 216 of the amplitude range.

In other embodiments, the supply voltage 126 may have a monotonic voltage response other than that shown in FIGS. 2a and 3a. For example, supply voltage 126 may be continually increasing during the intermediate region 206 of the amplitude range instead of being flat.

Figure 3B:
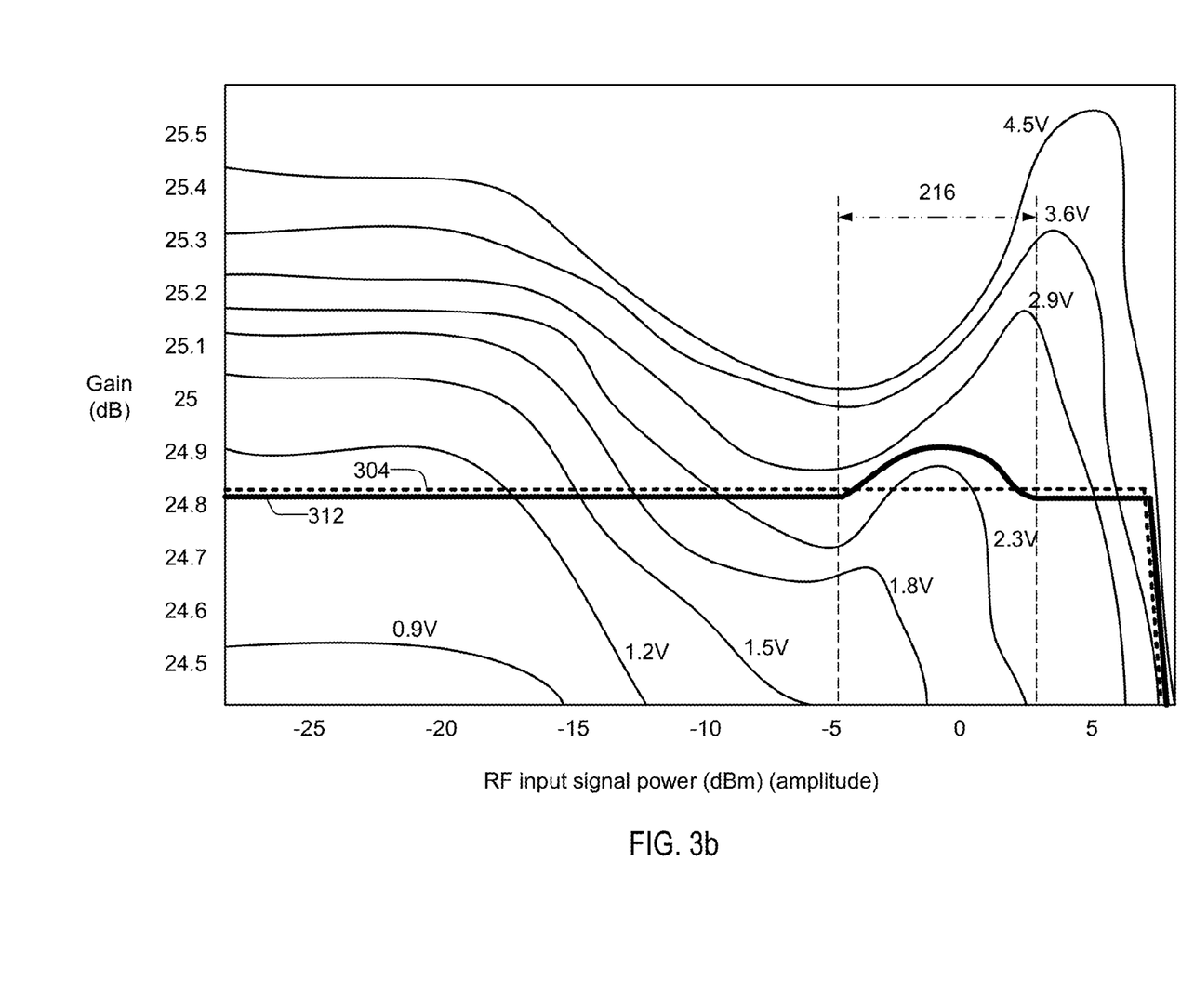
FIG. 3b is a graph illustrating the gain of the PA for monotonic and non-monotonic voltage responses of the supply voltage from FIG. 3a, according to an embodiment.
Figure 5:
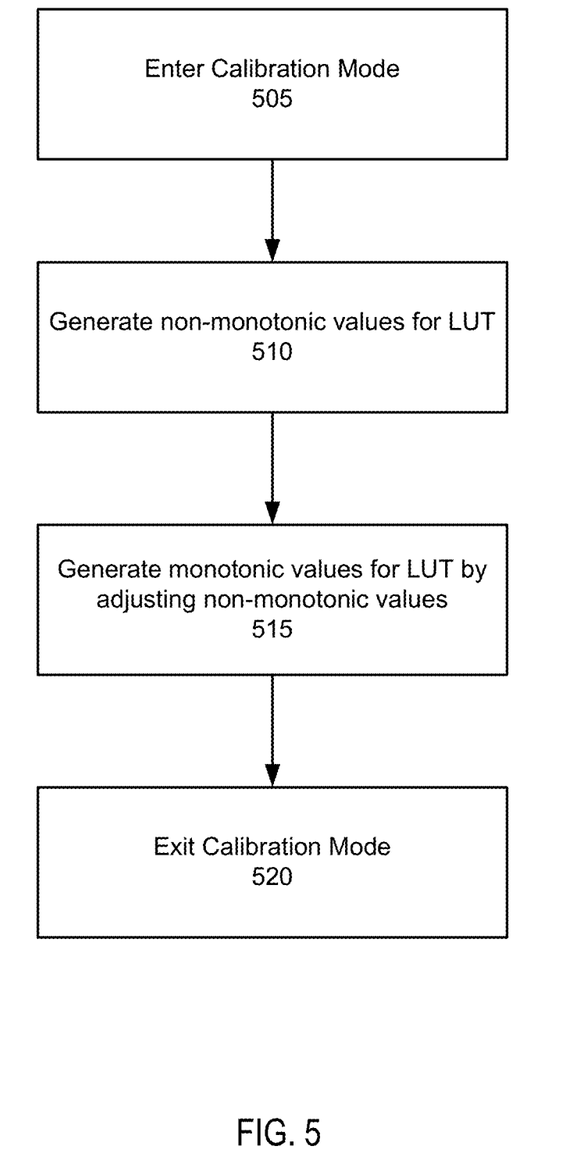
FIG. 5 is a flowchart of a method for calibrating the Look-Up Table (LUT) of the power supply controller as performed by the calibration block in the RF PA system of FIG. 1, according to an embodiment.

FIG. 3b is a graph illustrating the gain of the RF PA system 100 for monotonic 212 and non-monotonic voltage responses 204 of the supply voltage 126 from FIG. 3a, according to the another embodiment. FIG. 3b is similar to FIG. 2b, but now includes a new gain response 312 that represents the gain response 312 for the monotonic voltage response 212 of FIG. 3a. Specifically, the monotonic voltage response 212 is increased starting at a RF input signal power of −19 dBm until it reaches 2.6V at a RF input signal power of −5 dBm. The monotonic voltage response 212 is then substantially constant until the RF input signal power reaches 3 dBm. Because the monotonic voltage response 212 is held substantially constant but the overall gain response of the PA 110 is still changing, the gain 302 of the PA 110 temporarily increases to 24.9 dB as shown in FIG. 5. When the RF input signal power reaches 3 dBm, the supply voltage 126 is then increased again until it reaches the peak voltage of 4.5V, at which point the gain drops off.

Figure 4:
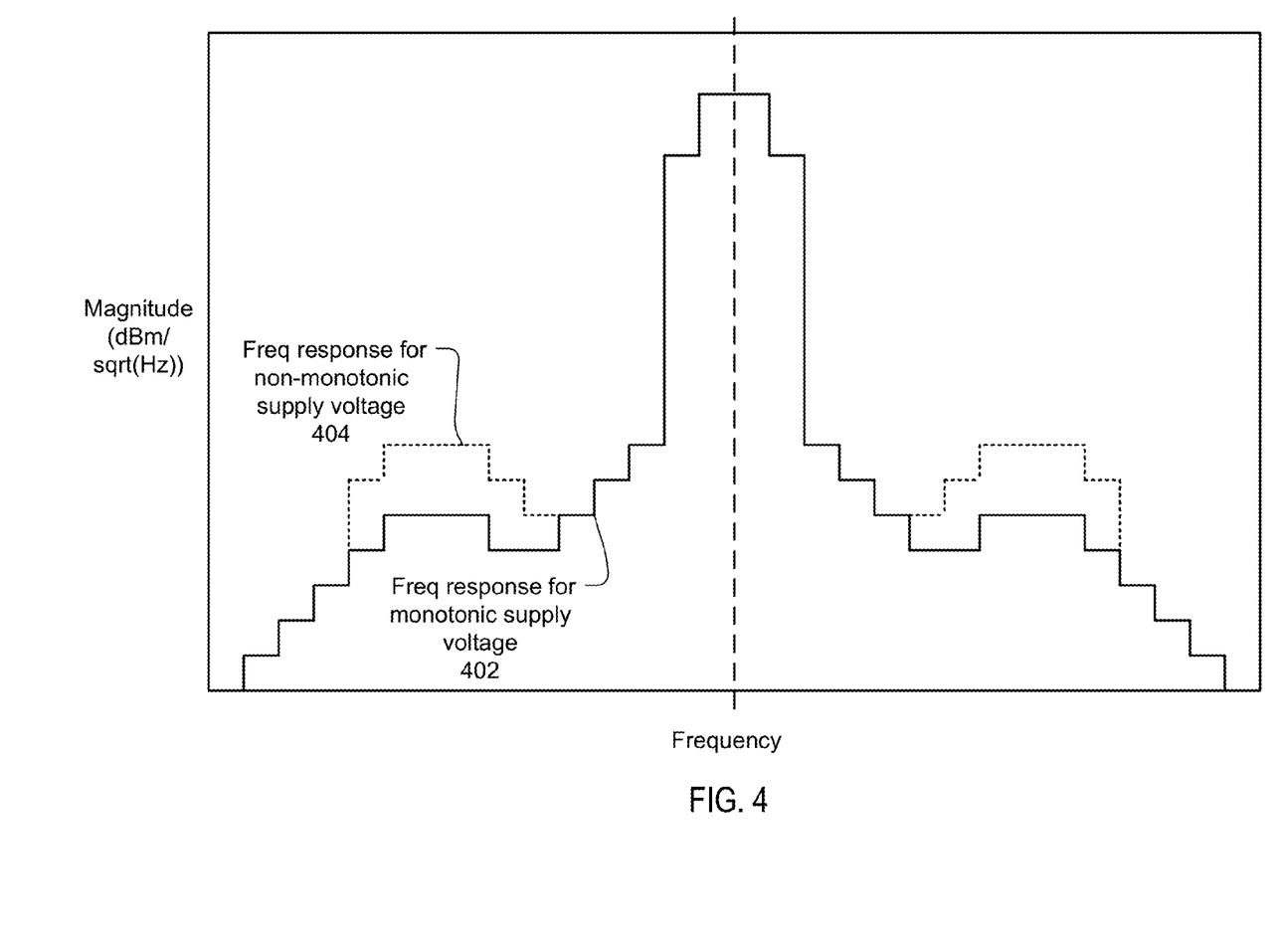
FIG. 4 is a Fast Fourier Transform (FFT) comparison of spectral efficiency of a RF output signal generated with a monotonic supply voltage and a RF output signal generated with a non-monotonic supply voltage, according to an embodiment.

FIG. 4 is a Fast Fourier Transform (FFT) comparison of spectral efficiency of a RF output signal 112 generated with a monotonic supply voltage 126 and a RF output signal 112 generated with a non-monotonic supply voltage 126 according to an embodiment. The solid line represents a frequency response 402 of an RF output signal 112 when the supply voltage 126 has a monotonic voltage response 202, and corresponds to the gain response 302 of the PA 110. The dotted line represents the frequency response 404 of the RF output signal 112 when the supply voltage 126 has a non-monotonic voltage response 204 and corresponds to the gain response 304 of the PA 110.

For the most part, frequency response 402 and 404 are similar. However, the frequency response 402 of an RF output signal 112 generated from a monotonic supply voltage 126 applied to the PA 110 has less spectral distortion than the frequency response 404 of an RF output signal 112 generated from a non-monotonic supply voltage 126 applied to the PA 110. This is because the monotonic supply voltage 126 has a reduced amount of spectral noise, which propagates through the PA 110 and also causes the RF output signal 112 to have less spectral noise.

Referring back to FIG. 1, the RF power amplifier system 100 also includes an amplitude detector 136 and calibration block 140 that together form a calibration path for calibrating the values in the LUT 120. When calibration is required, calibration block 140 enters a calibration mode and outputs a calibration control signal 142 to the baseband signal generator 102. Calibration control signal 142 controls the amplitude of the RF input signal 108 through control of the baseband signal 104 output by the baseband signal generator 102. In one embodiment, calibration block 140 may sweep the RF input signal 108 through a range of amplitudes in order to perform the calibration.

Directional coupler 132 generates a feedback signal 134 that represents an attenuated version of the RF output signal 112. Amplitude detector 136 detects an amplitude of the feedback signal 134 and generates an output amplitude signal 138 that is indicative of an amplitude of the RF output signal 112. In one embodiment, amplitude detector 136 may include circuits such as a series diode (not shown) to rectify the feedback signal 134 and a capacitor (not shown) to smooth the output of the diode. Calibration block 140 compares the input amplitude signal 138 to the output amplitude signal 138 to detect a gain of the PA 110. Calibration block 140 also adjusts the values in the LUT 120 via table adjustment signals 146. Table adjustment signals 146 may include one or more signals through which the calibration block 140 can communicate with the power supply controller 118 to read values in the LUT 120 and to make adjustments to the LUT 120.

FIG. 5 is a flowchart of a method for calibrating the LUT 120 performed by the calibration block 140, according to an embodiment. Initially, the LUT 120 may be un-calibrated and include a set of default values for the power supply control signal 122. In step 505, the calibration block 140 enters calibration mode in order to calibrate the values of the LUT 120.

In step 510, the calibration block 140 generates non-monotonic values for the LUT 510 that result in a constant gain in the PA 110. Specifically, through control signal 142, calibration block 140 sets the RF input signal 108 to a fixed amplitude level. Calibration block 140 measures the gain of the PA 110 by comparing the input feedback signal 116 to the output feedback signal 138. Calibration block 140 adjusts the values in the LUT 120 via adjustment signal 146 until the measured gain of the PA 110 reaches a target gain level. The PA 110 sweeps through a range of amplitudes for the RF input signal 108 and adjusts the values in the LUT 120 in this manner over the entire amplitude range of the RF input signal 108 in order to build a full LUT 120. The resulting LUT 120 includes values that cause the PA 110 to have constant gain across an amplitude range of the RF input signal 108. However, because the values for the LUT 120 are generated with a focus on constant gain, the LUT 120 could also be non-monotonic.

In step 515, the calibration block 140 generates monotonic values for the LUT 120 by adjusting the existing non-monotonic values in the LUT 120 until they are monotonic. In one embodiment, calibration block 140 analyzes the entries in the LUT 120 in descending order, starting with the entry in the LUT 120 that represents the highest RF input amplitude and ending with the entry in the LUT 120 that represents the lowest RF input amplitude. The calibration block 140 keeps track of the lowest value for the supply voltage control signal 122 that has been found so far. If a value for the supply voltage control signal 122 is lower than or equal to the lowest value found so far, the value is retained in the LUT 120. If a value for the supply voltage control signal 122 is higher than the lowest value found so far, it is replaced with the lowest value found so far.

Referring briefly to FIG. 2a, the calibration block 140 effectively processes the non-monotonic voltage response 204 from right to left and smoothes out the hump in the non-monotonic voltage response 204 to create a monotonic voltage response 202. In other embodiments, the calibration block 140 may use different algorithms that produce a different type of monotonic voltage response, such as the monotonic voltage response 212 from FIG. 3a.

Referring back to FIG. 5, in step 520, once calibration is completed, the calibration block 140 exits the calibration mode to put the RF PA system 100 back into normal operating mode. The RF PA system 100 can then use the monotonic values of the LUT 120 to generate a RF output signal 112 having a low amount of spectral noise.

In one embodiment, calibration of the LUT 120 can occur every time the RF PA system 100 is powered on. Alternatively, calibration of the LUT 120 may occur a single time, such as in a laboratory or other test environment. After the LUT 120 is calibrated one time, the values in the LUT 120 may be saved and transferred to other RF PA systems 100 for use as the LUT 120 for many different RF PA systems 100. In further embodiments, the calibration circuit 140 may simply reduce the amount of non-monoticity in the non-monotonic values to generate adjusted values for the LUT 120 that are still non-monotonic, but that have a reduced level of non-monoticity. For example, referring to FIG. 2a, the calibration circuit 140 may reduce the size of the hump in the non-monotonic response 204 without eliminating it completely.

Figure 6:
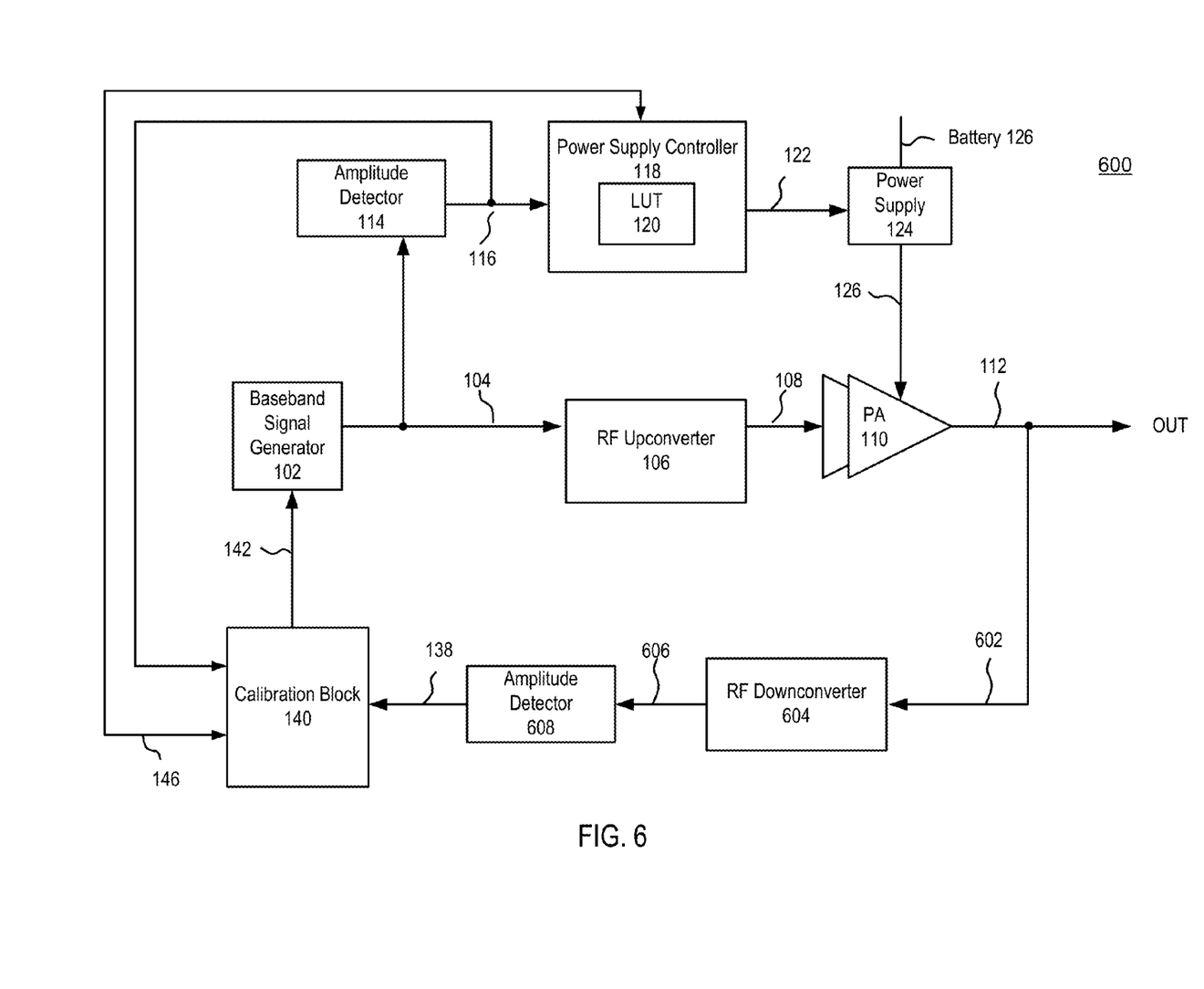
FIG. 6 illustrates a RF PA system, according to another embodiment.

FIG. 6 illustrates a RF PA system 600, according to another embodiment. The RF PA system 600 of FIG. 6 is similar to the RF PA system 100 of FIG. 1, but now includes a RF down converter 604 and an amplitude detector 608. RF down converter 604 converts the RF output signal 112 into a down converted output signal 606. In one embodiment, the down converted output signal 606 includes the digital modulation components (e.g., I and Q) of the RF output signal 112. Amplitude detector 608 receives the down converted output signal 606 and generates an output amplitude signal 138 that indicates an amplitude of the RF output signal 112. For example, amplitude detector 608 may compute the amplitude of the RF amplitude signal 112 as a function of its digital modulation components. Calibration block 140 then uses the output feedback signal 138 in calibrating the LUT 120.

Upon reading this disclosure, those of skill in the art will appreciate still additional alternative structural and functional designs for a RF PA system through the disclosed principles of the present disclosure. For example, the resulting gain variations in the PA 110 can be compensated by a gain predistortion system, enhancing the spectral quality of the RF PA system even further. Thus, while particular embodiments and applications of the present disclosure have been illustrated and described, it is to be understood that the embodiments of the present disclosure are not limited to the precise construction and components disclosed herein and that various modifications, changes and variations which will be apparent to those skilled in the art may be made in the arrangement, operation and details of the method and apparatus of the embodiments disclosed herein without departing from the spirit and scope of the disclosure.

What is claimed is:

1. A radio frequency (RF) power amplifier system comprising:
a power amplifier configured to amplify an RF input signal to generate an RF output signal, a gain of the power amplifier controlled by a supply voltage to the power amplifier;
an amplitude detector configured to generate an amplitude signal indicative of the amplitude of the RF input signal; and
a power supply configured to generate the supply voltage to the power amplifier based on the amplitude signal indicative of the amplitude of the RF input signal, the supply voltage being monotonic relative to the amplitude of the RF input signal across an amplitude range of the RF input signal,
wherein, during a first portion of the amplitude range of the RF input signal, the gain of the power amplifier is substantially constant while the supply voltage is adjusted monotonically relative to the amplitude of the RF input signal, and
wherein, during a second portion of the amplitude range of the RF input signal, the gain of the power amplifier is substantially non-constant while the supply voltage is adjusted monotonically relative to the amplitude of the RF input signal.

2. The RF power amplifier system of claim 1, wherein the supply voltage is non-decreasing as the amplitude of the RF input signal increases across the amplitude range of the RF input signal.

3. The RF power amplifier system of claim 1, wherein the gain of the power amplifier increases during the second portion of the amplitude range of the RF input signal.

4. The RF power amplifier system of claim 1, wherein the gain of the power amplifier decreases during the second portion of the amplitude range of the RF input signal.

5. The RF power amplifier system of claim 1, wherein the gain of the power amplifier both decreases and increases during the second portion of the amplitude range of the RF input signal.

6. The RF power amplifier system of claim 1, wherein, during a third portion of the amplitude range of the RF input signal, the gain of the power amplifier is substantially constant while the supply voltage is adjusted monotonically relative to the amplitude of the RF input signal, the second portion of the amplitude range being between the first and third portions of the amplitude range.

7. The RF power amplifier system of claim 6, wherein the gain of the power amplifier is at a target gain level during the first portion and the third portion of the amplitude range of the RF input signal.

8. The RF power amplifier system of claim 1, further comprising:
a power supply controller configured to generate a supply control signal based on the amplitude signal, the power supply controller generating the supply control signal by referencing the amplitude signal to a look-up table that includes values for the supply voltage control signal corresponding to levels of the amplitude signal, the values of the look-up table being monotonic relative to the amplitude of the RF input signal across the amplitude range of the RF input signal,
wherein the power supply is configured to generate the supply voltage to the power amplifier based on the supply control signal.

9. The RF power amplifier system of claim 8, further comprising:
a calibration circuit coupled to the power supply controller and configured to calibrate the values of the look-up table.

10. The RF power amplifier system of claim 9, wherein the calibration circuit calibrates the values of the look up table by:
generating non-monotonic values for the values of the look-up table, the non-monotonic values being non-monotonic relative to the amplitude of the RF input signal across an amplitude range of the RF input signal and corresponding to a substantially constant gain of the power amplifier across the amplitude range of the RF input signal; and
generating monotonic values for the values of the look-up table based on the non-monotonic values, the monotonic values being monotonic relative to the amplitude of the RF input signal across the amplitude range of the RF input signal.

11. A method of operation in a radio frequency (RF) power amplifier system, the method comprising:
generating an amplitude signal indicative of an amplitude of an RF input signal to a power amplifier, the power amplifier amplifying the RF input signal to generate an RF output signal; and
generating a supply voltage to the power amplifier based on the amplitude signal indicative of the amplitude of the RF input signal, the supply voltage being monotonic relative to the amplitude of the RF input signal across an amplitude range of the RF input signal, the power amplifier having a gain that is controlled by the supply voltage to the power amplifier
wherein, during a first portion of the amplitude range of the RF input signal, the gain of the power amplifier is substantially constant while the supply voltage is adjusted monotonically relative to the amplitude of the RF input signal, and
wherein, during a second portion of the amplitude range of the RF input signal, the gain of the power amplifier is substantially non-constant while the supply voltage is adjusted monotonically relative to the amplitude of the RF input signal.

12. A method of operation for a radio frequency (RF) power amplifier system, the RF power amplifier system including a power amplifier configured to amplify an RF input signal to generate an RF output signal, an amplitude detector configured to generate an amplitude signal indicative of the amplitude of the RF input signal, and a power supply controller configured to generate a power supply control signal for controlling a supply voltage to the power amplifier by referencing a look-up table of values for the supply voltage control signal that correspond to levels of the amplitude signal, the method comprising:
generating non-monotonic values for the values of the look-up table, the non-monotonic values being non-monotonic relative to the amplitude of the RF input signal across an amplitude range of the RF input signal and corresponding to a substantially constant gain of the power amplifier across the amplitude range of the RF input signal; and
generating monotonic values for the values of the look-up table based on the non-monotonic values, the monotonic values being monotonic relative to the amplitude of the RF input signal across the amplitude range of the RF input signal.

13. The method of claim 12, wherein the non-monotonic values are both increasing and decreasing as the amplitude of the RF input signal increases across the amplitude range of the RF input signal.

14. The method of claim 12, wherein the monotonic values are non-decreasing as the amplitude of the RF input signal increases across the amplitude range of the RF input signal.

15. The method of claim 12, wherein the monotonic values are generated based on the non-monotonic values by adjusting a non-monotonic portion of the non-monotonic values.

16. The method of claim 15, wherein the non-monotonic portion of the non-monotonic values is a negative dip in the non-monotonic values.

17. The method of claim 15, wherein the non-monotonic portion of the non-monotonic values is a positive hump in the non-monotonic values.

18. The method of claim 12, further comprising:
transferring the monotonic values to a plurality of other RF power amplifier systems.

19. The method of claim 12, further comprising:
operating the RF power amplifier system with the monotonic values.

* * * * *